United States Patent
Kim et al.

(10) Patent No.: US 8,324,109 B2
(45) Date of Patent: Dec. 4, 2012

(54) METHOD FOR FABRICATING SEMICONDUCTOR DEVICE

(75) Inventors: Tae-Han Kim, Gyeonggi-do (KR); Dong-Hyun Kim, Gyeonggi-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 321 days.

(21) Appl. No.: 12/642,496

(22) Filed: Dec. 18, 2009

(65) Prior Publication Data

US 2010/0297840 A1    Nov. 25, 2010

(30) Foreign Application Priority Data

May 22, 2009  (KR) .................. 10-2009-0044854

(51) Int. Cl.
*H01L 21/302*  (2006.01)
*H01L 21/461*  (2006.01)

(52) U.S. Cl. ............... 438/734; 438/588; 257/E21.214; 216/67

(58) Field of Classification Search .......... 438/689–700, 438/734, 739, 652, 588; 257/E21.214–E21.4; 216/67–71
See application file for complete search history.

(56) References Cited

U.S. PATENT DOCUMENTS 6,184,081 B1 *  2/2001  Jeng et al. .................... 438/253

FOREIGN PATENT DOCUMENTS

| KR | 1020050070320 | 7/2005 |
| KR | 1020080029649 | 4/2008 |
| KR | 1020100073516 | 7/2010 |

OTHER PUBLICATIONS

Notice of Allowance issued from Korean Intellectual Property Office on Jul. 25, 2011.

* cited by examiner

*Primary Examiner* — Julio J Maldonado
*Assistant Examiner* — Sonya McCall Shepard
(74) *Attorney, Agent, or Firm* — IP & T Group LLP

(57) ABSTRACT

A method for fabricating a semiconductor device includes forming a gate insulation layer over a substrate, sequentially forming a silicon layer and a metal layer over the gate insulation layer, performing a first gate etching process to etch the metal layer using a gate hard mask layer, formed on the metal layer, as an etch barrier, and then partially etch the silicon layer, thereby forming a first pattern, performing a second gate etching process to partially etch the silicon layer, thereby forming an undercut beneath the metal layer, forming a capping layer on both sidewalls of the first pattern including the undercut, performing a third gate etching process to etch the silicon layer to expose the gate insulation layer using the gate hard mask layer and the capping layer as an etch barrier, thereby forming a second pattern, and performing a gate re-oxidation process.

13 Claims, 5 Drawing Sheets

METHOD FOR FABRICATING SEMICONDUCTOR DEVICE

CROSS-REFERENCE TO RELATED APPLICATION

The present application claims priority of Korean Patent Application No. 10-2009-0044854, filed on May 22, 2009, which is incorporated herein by reference in its entirety.

BACKGROUND OF THE INVENTION

Exemplary embodiments of the present invention relate to technology of fabricating a semiconductor device, and more particularly, to a method for fabricating a semiconductor device including a gate electrode of a poly-metal structure.

Recently, there has been introduced a gate electrode of a structure where a poly-silicon (Si) layer and a metal layer having low resistance and a high melting point, such as a tungsten (W) layer, are sequentially stacked (i.e., forming a so-called poly-metal structure), to provide operational properties that a highly integrated semiconductor device requires. The gate electrode of the poly-metal structure that is widely used recently has a poly-Si/WN/W structure where the poly-Si layer, a tungsten nitride (WN) layer and the W layer are sequentially stacked. At this time, the WN layer is used as a barrier metal layer to prevent a reaction from occurring between the W layer and the poly-Si layer during processes performed on the gate electrode.

Meanwhile, a process of forming a gate pattern by selectively etching a gate structure, including the poly-Si layer, the WN layer, and the W layer that are sequentially stacked on a gate insulation layer, generates micro-trench and plasma damage in the gate insulation layer. Therefore, a gate re-oxidation process is performed to cure the damage of the gate insulation layer, and a capping layer is formed on sidewalls of the W layer and the WN layer to prevent the W layer and the WN layer from being oxidized in the re-oxidation process.

FIGS. 1A to 1C are cross-sectional views illustrating a method for fabricating a conventional semiconductor device including a gate electrode of a poly-metal structure.

Referring to FIG. 1A, a first pattern 101 is formed by sequentially forming a gate insulation layer 12, a poly-Si layer 13, a WN layer 14 and a W layer 15 on a substrate 11, etching the W layer 15 and the WN layer 14 using a gate hard mask layer 16 on the W layer 15 as an etch barrier, and then partially etching the poly-Si layer 13.

Subsequently, a nitride layer 17 for a capping layer (later formed) is deposited along the surface of a resultant structure including the first pattern 101.

Referring to FIG. 1B, a capping layer 17A is formed on both sidewalls of the first pattern 101 by performing an overall etching process, e.g., an etch-back process, on the nitride layer 17.

Then, a second pattern 102 is formed by etching the remaining portion of the poly-Si layer 13 using the gate hard mask layer 16 and the capping layer 17A as an etch barrier. At this time, the second pattern 102 is usually referred to as a gate pattern. Hereinafter, the etched poly-Si layer is represented by reference numeral '13A'.

Referring to FIG. 1C, a gate re-oxidation process is performed to cure plasma damage and micro-trench generated in the gate insulation layer 12 that is exposed when forming the second pattern 102. By performing the gate re-oxidation process, an oxide layer 18 is formed on both sidewalls of the etched poly-Si layer 13A at the same time the damage to the gate insulation layer 12 is cured.

However, referring to FIG. 1A, the poly-Si layer 13 of the first pattern 101 has a sidewall S of a negative slope as a result of the difference of the etch selectivity of the W layer 15 and the WN layer 14 in comparison to the poly-Si layer 13. The sidewall S having a negative slope is formed when performing the etching process for forming the first pattern 101. Therefore, when forming the capping layer 17A, a thickness of the capping layer 17A formed on the sidewalls of the first pattern 101 becomes relatively small at the interface of the poly-Si layer 13 and the WN layer 14. Thus, as a result of etching the remaining poly-Si layer 13 to form the second pattern 102, there occurs a problem in that the sidewall of the interface of the poly-Si layer 13A and the WN layer 14 is exposed.

As the sidewall of the interface of the poly-Si layer 13A and the WN layer 14 is exposed, oxygen penetrates through the interface when performing the gate re-oxidation process, and thus, an insulation layer 19 including a tungsten oxide ($WO_x$) or silicon oxide ($SiO_x$) component may be generated. The insulation layer 19 increases the gate resistance, and thus, causes a problem such as a signal delay in a high-frequency operation.

SUMMARY OF THE INVENTION

An embodiment of the present invention is directed to providing a method for fabricating a semiconductor device, capable of preventing a sidewall of the poly-metal interface from being exposed by the damage to a capping layer in the semiconductor device, including a gate electrode of a poly-metal structure.

Another embodiment of the present invention is directed to providing a method for fabricating a semiconductor device, capable of improving the gate resistance by preventing an insulation layer from being generated on the poly-metal interface when performing a gate re-oxidation process in the semiconductor device, including a gate electrode of a poly-metal structure.

In accordance with an embodiment of the present invention, a method for fabricating a semiconductor device, the method includes forming a gate insulation layer over a substrate, sequentially forming a silicon layer and a metal layer over the gate insulation layer, performing a first gate etching process to etch the metal layer using a gate hard mask layer, formed on the metal layer, as an etch barrier, and then partially etch the silicon layer, thereby forming a first pattern, performing a second gate etching process to partially etch the silicon layer, thereby forming an undercut beneath the metal layer, forming a capping layer on both sidewalls of the first pattern including the undercut, performing a third gate etching process to etch the silicon layer to expose the gate insulation layer using the gate hard mask layer and the capping layer as an etch barrier, thereby forming a second pattern, and performing a gate re-oxidation process. The first, second and third gate etching processes are performed in-situ in one chamber.

The second gate etching process may be performed using isotropic etching.

The first and third gate etching processes may be performed using anisotropic etching.

The second gate etching process may be performed using a bias power smaller than that used in the first gate etching process.

The first gate etching process may be performed using the bias power in a range of approximately 100 W to approximately 200 W.

The second gate etching process may be performed using the bias power in a range of approximately 10 W to approximately 20 W.

The second gate etching process may be performed under higher pressure than the first gate etching process.

The first gate etching process may be performed under the pressure in a range of approximately 1 mTorr to approximately 3 mTorr.

The second gate etching process may be performed under the pressure in a range of approximately 4 mTorr to approximately 10 mTorr.

The second gate etching process may be performed at lower temperature than the first gate etching process.

The first gate etching process may be performed at the temperature in a range of approximately 70° C. to approximately 80° C.

The second gate etching process may be performed at the temperature in a range of approximately 30° C. to approximately 60° C.

DESCRIPTION OF SPECIFIC EMBODIMENTS

Figure 1A:
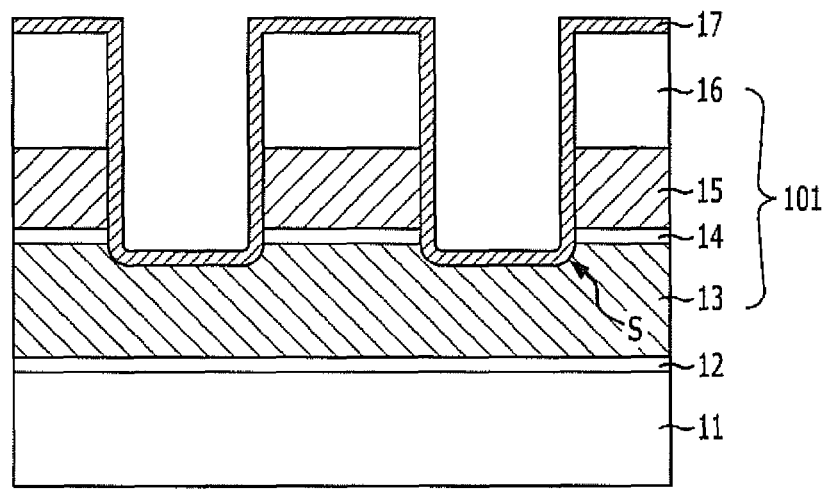
FIGS. 1A to 1C are cross-sectional views illustrating a method for fabricating a conventional semiconductor device including a gate electrode of a poly-metal structure.
Figure 1B:
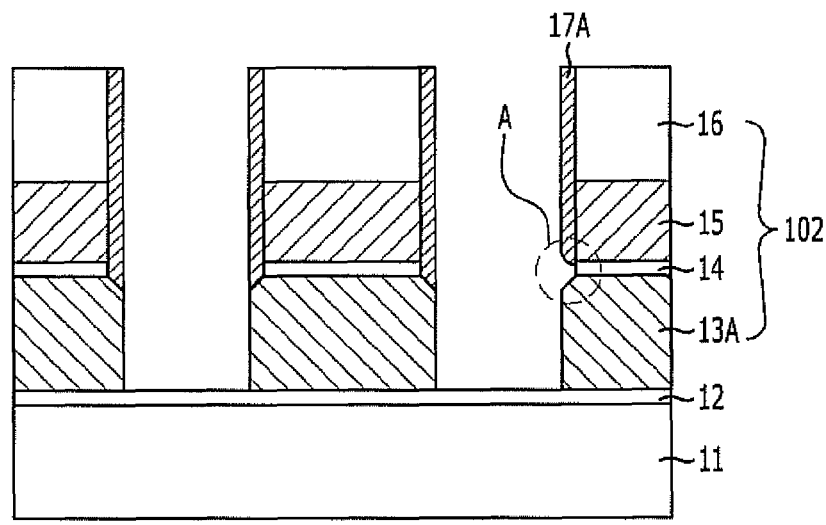
Figure 1C:
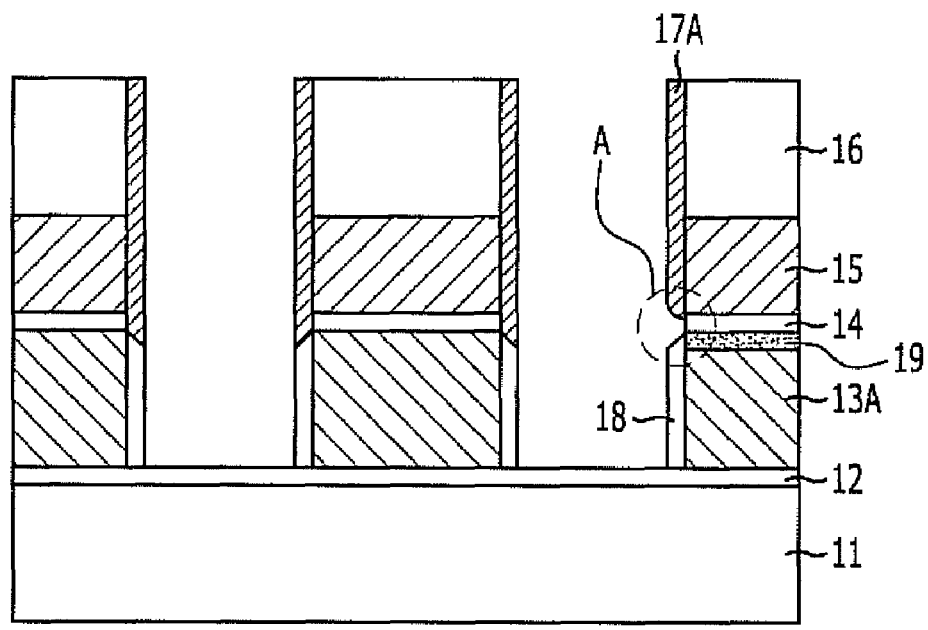

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the prevent invention.

Other objects and advantages of the present invention can be understood by the following description, and become apparent with reference to the embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate, but also a case where a third layer exists between the first layer and the second layer or the substrate. Furthermore, the same or like reference numerals represent the same or like constituent elements, although they appear in different embodiments or drawings of the present invention.

The present application provides a method for fabricating a semiconductor device including a gate electrode of a poly-metal structure. The inventive semiconductor device can prevent an insulation layer from being generated on the poly-metal interface, wherein the insulation layer that may be generated as a capping layer is partially removed, so a sidewall of the poly-metal interface is exposed.

FIGS. 2A to 2E are cross-sectional views illustrating a method for fabricating a semiconductor device including a gate electrode of a poly-metal structure in accordance with an embodiment of the present invention.

Figure 2A:
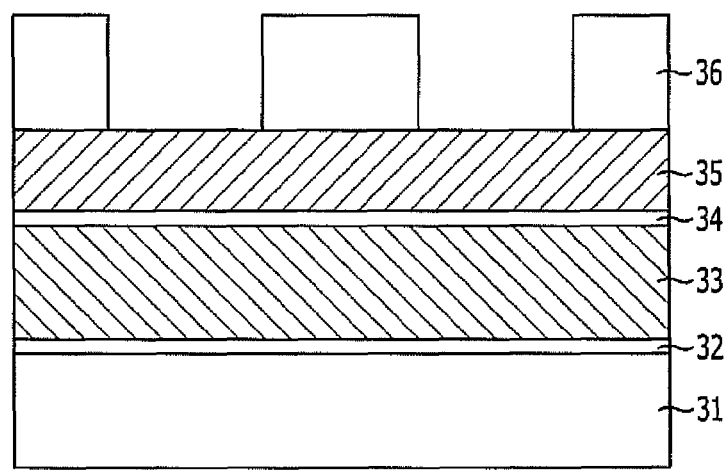
FIGS. 2A to 2E are cross-sectional views illustrating a method for fabricating a semiconductor device including a gate electrode of a poly-metal structure in accordance with an embodiment of the present invention.

Referring to FIG. 2A, a gate insulation layer 32 is formed on a substrate 31. The gate insulation layer 32 may include an oxide layer, (e.g., a silicon oxide ($SiO_2$) layer), and the oxide layer may be formed by performing a thermal oxidation process.

Additionally, nitridation treatment may be performed on the gate insulation layer 32 to prevent impurities contained in a silicon layer 33 from penetrating into the substrate 31 during subsequent processes. The nitridation treatment may be performed through the furnace thermal treatment or the rapid thermal treatment in a nitrogen-containing gas (e.g., a $N_2O$ or NO gas) atmosphere.

Subsequently, the silicon layer 33, a barrier metal layer 34, a metal layer 35, and a gate hard mask layer 36 are sequentially formed on the gate insulation layer 32. The silicon layer 33 may be formed with a poly-Si layer. Moreover, the silicon layer 33 may be formed with a silicon germanium (SiGe) layer. At this time, it is preferable to form the silicon layer 33 with a doped silicon layer where impurities are doped. The barrier metal layer 34 acts as a diffusion barrier layer for preventing mutual diffusion and mutual reaction from occurring on the interface where the silicon layer 33 and the metal layer 35 are adjacent to each other, as a result of subsequent processes. The diffusion barrier layer 34 (i.e., the barrier metal layer 34) may be formed with refractory metal, e.g., one selected from a group consisting of titanium (Ti), cobalt (Co), molybdenum (Mo), platinum (Pt), iridium (Ir), Ruthenium (Ru), chrome (Cr), tantalum (Ta), zirconium (Zr) and a stacked layer thereof. Moreover, the diffusion barrier layer 34 may include a metal nitride layer formed by combining the refractory metal and nitrogen (N) (e.g., a tungsten nitride (WN) layer), or a metal silicide layer formed by combining the refractory metal and silicon (Si). In one example, where the silicon layer 33 includes a poly-Si layer and the metal layer 35 includes a tungsten layer, the barrier metal layer 34 may be formed with a stacked layer (Ti/WN/WSi) where a Ti layer, a WN layer and a tungsten silicide (WSi) layer are sequentially stacked. As in the example immediately above, the metal layer 35 may be formed with a W layer. In addition, the metal layer 35 may be formed with one selected from a group consisting of Mo, Ta, Ti, Ru, Ir, and Pt. The gate hard mask layer 36 may be formed with one selected from a group consisting of an oxide layer, a nitride layer, an oxynitride layer, and a stacked layer thereof.

Still referring to FIG. 2A, a photoresist pattern (not shown) is formed on the gate hard mask layer 36, and then the gate hard mask layer 36 is etched using the photoresist pattern as an etch barrier.

Figure 2B:
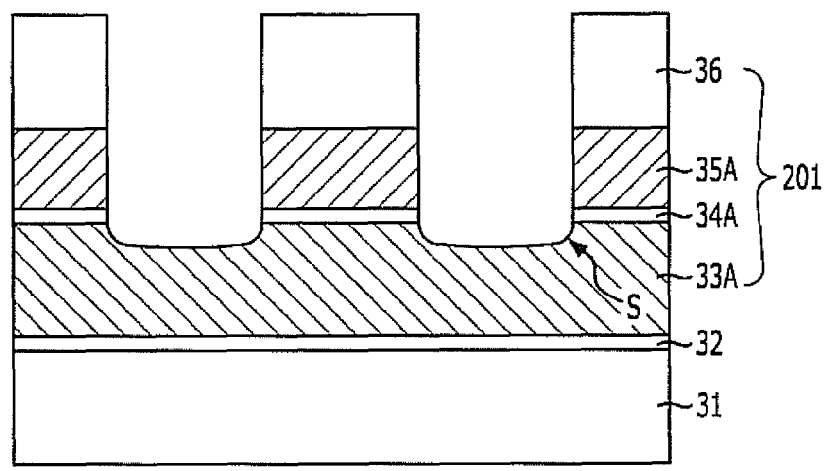

Referring to FIG. 2B, a first pattern 201 is formed by etching the metal layer 35 and the barrier metal layer 34 using the etched gate hard mask layer 36 as an etch barrier, and then partially etching the silicon layer 33. Hereinafter, the etching process for forming the first pattern 201 is referred to as 'a first gate etching process'; the etched metal layer is represented by reference numeral '35A'; the etched barrier metal layer is represented by reference numeral '34A'; and the partially etched silicon layer is represented by reference numeral '33A'.

The first gate etching process may be performed through a dry etching process using plasma, and the first pattern 201 may be formed by performing an anisotropic etching process so that a sidewall of the first pattern 201 has a vertical profile.

Furthermore, the first gate etching process may be performed using a mixed gas of a $NF_3$ gas, a $SF_6$ gas, and a $Cl_2$ gas. At this time, the $NF_3$ gas, the $SF_6$ gas, and the $Cl_2$ gas may be supplied at flow rates of 5 sccm to 15 sccm, 5 sccm to 15 sccm, and 50 sccm to 70 sccm, respectively. The mixed gas may further include a nitrogen ($N_2$) gas and a helium (He) gas to improve the effectiveness of the etching process. Herein, each of the $N_2$ gas and the He gas may be supplied at a flow rate of 20 sccm to 40 sccm.

The first gate etching process may be performed under pressure in a range of 1 mTorr to 3 mTorr and at temperature in a range of 70° C. to 80° C.

The first gate etching process may be performed using a source power in a range of 500 W to 700 W and a bias power in a range of 100 W to 200 W.

Herein, when performing the etching process for forming the first pattern 201, a sidewall S of the etched silicon layer 33A has a negative slope as a result of the difference of the etch selectivity of the metal layer 35 and the barrier metal layer 34 in comparison to the silicon layer 33. In this case, where the sidewall S of the etched silicon layer 33A of the first pattern 201 has the negative slope, a capping layer, formed in a subsequent process, on a sidewall of the interface of the etched silicon layer 33A and the etched barrier metal layer 34A, has a relatively small thickness thereby causing a problem in that the sidewall of the interface is exposed.

Figure 2C:
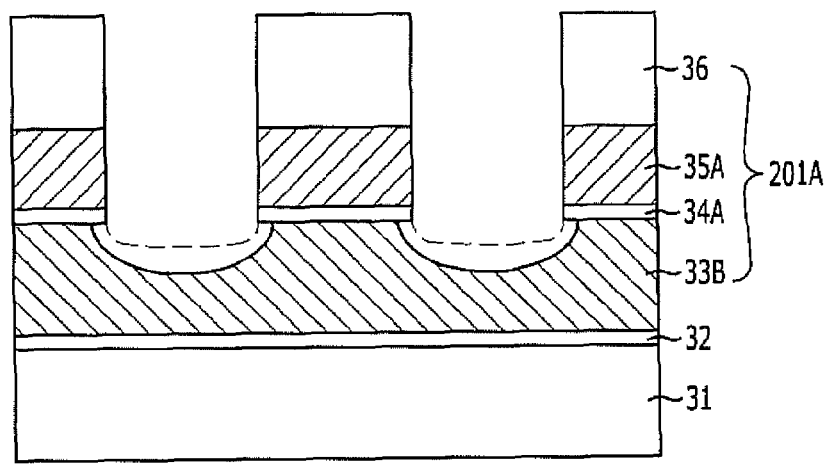

Therefore, to overcome the above problem occurring as a result of the sidewall S of the etched silicon layer 33A of the first pattern 201 having the negative slope, the etched silicon layer 33A is further partially etched to form the undercut beneath the etched barrier metal layer 34A, as illustrated in FIG. 2C. Hereinafter, the etching process for forming the undercut is referred to as 'a second gate etching process'; the silicon layer where the undercut is formed is represented by reference numeral '33B', and the first pattern including the undercut is represented by reference numeral '201A'.

The second gate etching process may be performed through a dry etching process using plasma, and it is preferable to perform an anisotropic etching process to form the undercut beneath the etched barrier metal layer 34A. Moreover, the second gate etching process and the first gate etching process may be performed in-situ in the same chamber to enhance the productivity of the semiconductor device.

The second gate etching process may be performed using a $Cl_2$ gas. At this time, the $Cl_2$ gas may be supplied at a flow rate of 50 sccm to 70 sccm. The second gate etching process may be performed by adding a $N_2$ gas and a He gas to the $Cl_2$ gas to enhance the effectiveness of the etching process. Herein, the $N_2$ gas and the He gas may be supplied at flow rates of 10 sccm to 20 sccm and 20 sccm to 40 sccm, respectively. Further, the second gate etching process may be performed using a mixed gas obtained by removing the $NF_3$ gas and the $SF_6$ gas from the etching gas used in the first gate etching process. Since the $NF_3$ gas and the $SF_6$ gas are used to etch the etched metal layer 35A and the etched barrier metal layer 34A, if these gases are also used in the second gate etching process, then profiles of sidewalls of the etched metal layer 35A and the etched barrier metal layer 34A may be changed.

Furthermore, the second gate etching process may be performed under higher pressure and at lower temperature compared with the first gate etching process. In particular, the second gate etching process may be performed under pressure in a range of 4 mTorr to 10 mTorr and at temperature in a range of 30° C. to 60° C. For reference, as the pressure in the etching process increases and the temperature decreases, a mean free path of ions formed by the plasma is reduced, and thus, an isotropic etching property is enhanced.

The second gate etching process may be performed using a source power equal to that used in the first gate etching process and a bias power lower than that used in the first gate etching process. In particular, the second gate etching process may be performed using the source power in a range of 500 W to 700 W and the bias power in a range of 10 W to 20 W. For reference, the bias power is a parameter for adjusting the straightness of ions, and thus, the straightness of the ions is reduced as the bias power is reduced, so that the isotropic etching property is enhanced. The source power plays a role of generating the plasma.

Figure 2D:
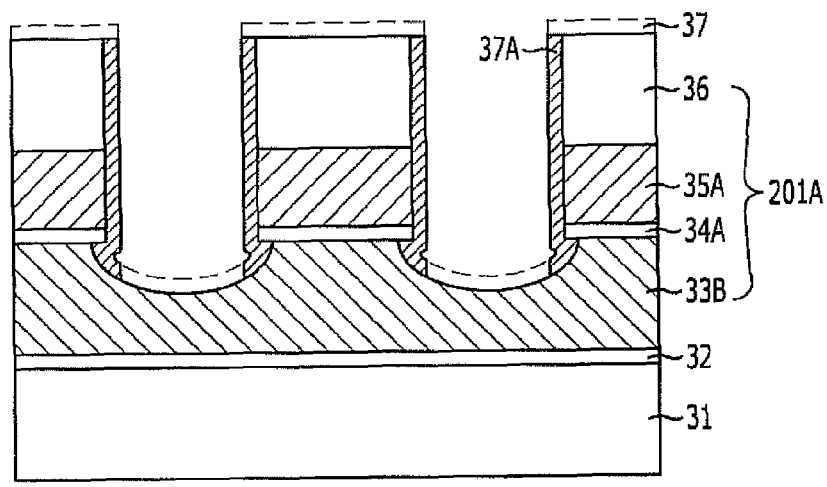

Referring to FIG. 2D, the capping layer 37A is formed on both sidewalls of the first pattern 201A including the undercut. The capping layer 37A may be formed with a nitride layer, e.g., a $Si_3N_4$ layer.

In particular, the capping layer 37A may be formed by forming an insulation layer 37 for the capping layer (e.g., a nitride layer) having a certain thickness along the surface of a resultant structure including the first pattern 201A, and then performing an overall etching process leaving only those portions of the insulation layer 37 on the sidewalls of the first pattern 201A including the undercut. Herein, the overall etching process may be performed through an etch-back process.

Herein, in accordance with the present invention, by forming the undercut beneath the etched barrier metal layer 34A, it is possible to prevent the capping layer 37A from having a small thickness on the sidewall of the interface of the etched barrier metal layer 34A and the silicon layer 32B.

Figure 2E:
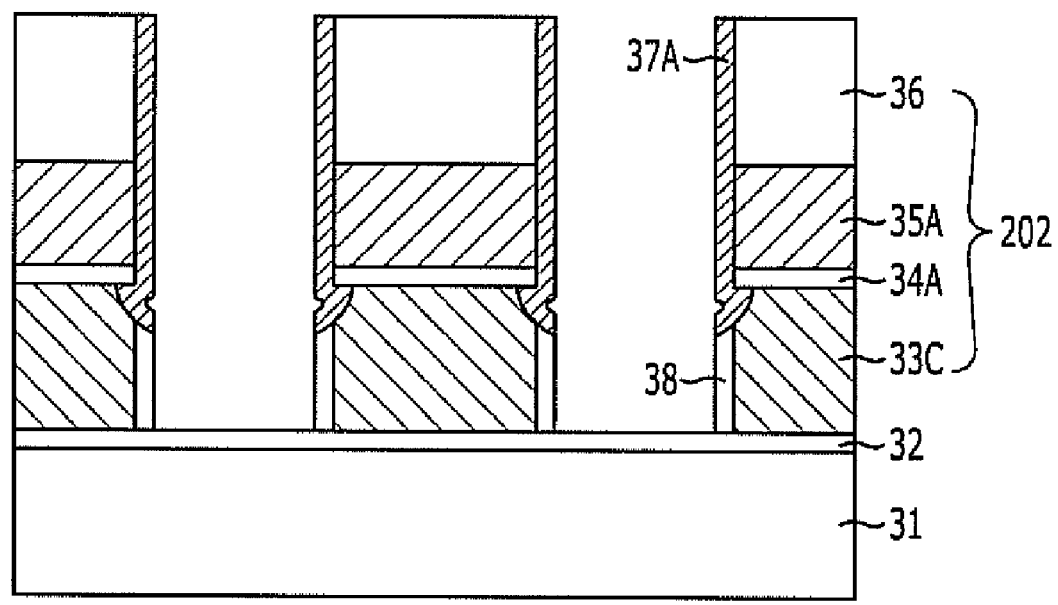

Referring to FIG. 2E, a second pattern 202 is formed by etching the silicon layer 33B using the gate hard mask layer 36 and the capping layer 37A as an etch barrier. Herein, the second pattern 202 is usually referred to as a gate pattern. Hereinafter, the etching process for forming the second pattern 202 is referred to as 'a third gate etching process' and the silicon layer obtained in the etching process is represented by reference numeral '33C'.

The third gate etching process may be performed through a dry etching process using plasma. It is preferable to perform an anisotropic etching process to form a sidewall of the silicon layer 33C to have a vertical profile. Also, the third gate etching process may be performed in-situ in the chamber where the first and second gate etching processes are performed.

Herein, micro-trench and plasma damage may be generated in the gate insulation layer 32 exposed in the third gate etching process.

Therefore, an oxide layer 38 is formed on the sidewall of the silicon layer 33C to prevent the short between the silicon layer 33C and a landing plug to be formed in a subsequent process, and at the same time the damage incurred to the gate insulation layer 32 is cured. That is, a gate re-oxidation process is performed. The gate re-oxidation process may be performed through high-temperature thermal treatment in an oxygen atmosphere, wherein the high-temperature is in a range of 600° C. to 900° C.

Herein, in accordance with the present invention, it is possible to prevent the sidewall of the interface of the silicon layer 33C and the etched barrier metal layer 34A from being exposed, although a portion of the capping layer 37A is removed in the third gate etching process, by preventing the capping layer 37A from being formed with a relatively small thickness on the sidewall of the interface. Therefore, it is possible to prevent the oxygen component from penetrating to the interface of the silicon layer 33C and the etched barrier metal layer 34A when performing the gate re-oxidation process, and thus, to prevent an insulation layer from being formed on the interface. As a result, it is possible to prevent the resistance of the gate from increasing.

As described above, the present invention has an effect capable of preventing the insulation layer from being formed on the interface in the gate re-oxidation process. This is accomplished by preventing the capping layer, formed on the sidewall of the interface of the silicon layer and the metal layer, from having a relatively smaller thickness at the interface between the silicon layer and the etched barrier metal, layer, which is accomplished by forming the undercut beneath the metal layer through the second gate etching process. Through this, the present invention can prevent the increase of the gate resistance due to the insulation layer generated on the interface of the silicon layer and the metal layer.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, the method comprising:
   forming a gate insulation layer over a substrate;
   sequentially forming a silicon layer and a metal layer over the gate insulation layer;
   performing a first gate etching process to etch the metal layer using a gate hard mask layer, formed on the metal layer, as an etch barrier, and then partially etch the silicon layer, thereby forming a first pattern;
   performing a second gate etching process to partially etch the silicon layer beneath the metal layer while not exposing the gate insulation layer, thereby forming an undercut beneath the metal layer;
   forming a capping layer on both sidewalls of the first pattern including the undercut;
   performing a third gate etching process to etch the silicon layer to expose the gate insulation layer using the gate hard mask layer and the capping layer as an etch barrier, thereby forming a second pattern; and
   performing a gate re-oxidation process.

2. The method of claim 1, wherein the first, second and third gate etching processes are performed in-situ in one chamber.

3. The method of claim 1, wherein the second gate etching process is performed using isotropic etching.

4. The method of claim 1, wherein the first and third gate etching processes are performed using anisotropic etching.

5. The method of claim 1, wherein the second gate etching process is performed using a bias power smaller than that used in the first gate etching process.

6. The method of claim 5, wherein the first gate etching process is performed using the bias power in a range of approximately 100 W to approximately 200 W.

7. The method of claim 5, wherein the second gate etching process is performed using the bias power in a range of approximately 10 W to approximately 20 W.

8. The method of claim 1, wherein the second gate etching process is performed under higher pressure than the first gate etching process.

9. The method of claim 8, wherein the first gate etching process is performed under the pressure in a range of approximately 1 mTorr to approximately 3 mTorr.

10. The method of claim 8, wherein the second gate etching process is performed under the pressure in a range of approximately 4 mTorr to approximately 10 mTorr.

11. The method of claim 1, wherein the second gate etching process is performed at lower temperature than the first gate etching process.

12. The method of claim 11, wherein the first gate etching process is performed at the temperature in a range of approximately 70° C. to approximately 80° C.

13. The method of claim 11, wherein the second gate etching process is performed at the temperature in a range of approximately 30° C. to approximately 60° C.

* * * * *